US008508211B1

(12) United States Patent
Anderson

(10) Patent No.: US 8,508,211 B1

(45) Date of Patent: Aug. 13, 2013

(54) METHOD AND SYSTEM FOR DEVELOPING LOW NOISE BANDGAP REFERENCES

(75) Inventor: Michael Brian Anderson, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 294 days.

(21) Appl. No.: 12/616,996

(22) Filed: Nov. 12, 2009

(51) Int. Cl.
*H01L 35/00* (2006.01)
*G05F 1/10* (2006.01)
*G05F 3/16* (2006.01)

(52) U.S. Cl.
USPC ............................ 323/313; 327/513; 327/539

(58) Field of Classification Search
USPC ................................. 323/311–316; 327/539
See application file for complete search history.

(56) References Cited

U.S. PATENT DOCUMENTS 4,249,122 A * 2/1981 Widlar .......................... 323/313
4,447,784 A * 5/1984 Dobkin ......................... 323/226
4,749,889 A * 6/1988 Lagoni et al. ................. 327/513
5,325,045 A * 6/1994 Sundby ......................... 323/313
6,060,874 A * 5/2000 Doorenbos ................... 323/316
6,288,525 B1 * 9/2001 Fischer ......................... 323/313
7,242,240 B2 * 7/2007 Gierkink ....................... 327/539
7,595,627 B1 * 9/2009 Mahnke et al. ............... 323/316
7,863,882 B2 * 1/2011 Harvey ......................... 323/313

* cited by examiner

*Primary Examiner* — Bao Q Vu
*Assistant Examiner* — Zekre Tsehaye
(74) *Attorney, Agent, or Firm* — McDermott Will & Emery LLP

(57) ABSTRACT

Method and system for developing low noise bandgap references. A stacked $\Delta V_{BE}$ generator is disclosed for generating $\Delta V_{BE}$. The stacked $\Delta V_{BE}$ generator includes an error amplifier configured to generate an output based on an error signal provided by a first stack of the $\Delta V_{BE}$ generator. The first stack of the $\Delta V_{BE}$ is coupled to a first sub-circuit and the error amplifier to form a closed loop. The first sub-circuit is coupled to a power supply and ground and configured to provide a source current between the power supply and the ground. The stacked $\Delta V_{BE}$ generator also includes a second sub-circuit coupled to the output of the error amplifier, the first and second stacks, and the ground, as well as a second stack of the $\Delta V_{BE}$ generator, which is coupled to the first stack and the second sub-circuit. The $\Delta V_{BE}$ is measured at outputs of the first and second stacks and equals the sum of individual $\Delta V_{BE}$s of the first and second stacks.

36 Claims, 10 Drawing Sheets

METHOD AND SYSTEM FOR DEVELOPING LOW NOISE BANDGAP REFERENCES

BACKGROUND

1. Technical Field

The present teaching is related to analog circuit design. More specifically, the present teaching is related to a method of and system for low noise bandgap reference circuit and systems incorporating the same.

2. Discussion of Technical Background

Bandgap voltage references are generally produced by summing a Proportional To Absolute Temperature (PTAT) voltage and a Complementary To Absolute Temperature (CTAT) voltage together to generate a temperature independent voltage. A CTAT voltage can be produced using a diode or diode connected Bipolar Junction Transistor (BJT). A PTAT voltage can be produced by developing a voltage across a resistor with a PTAT current.

A $\Delta V_{BE}$ circuit may be employed to generate a PTAT current using two BJTs with different current densities. The PTAT current used is usually proportional to the logarithm of the current density ratio of the two BJTs and can be mathematically described as $I_{PTAT}=\Delta V_{BE}/R=(V_T/R)*\ln(J_1/J_2)$. The logarithm function attenuates the ratio, making it necessary to use a large number of transistors in order to achieve a higher performance bandgap voltage reference.

A different approach of producing a large $\Delta V_{BE}$ is to employ a "cross-connected quad", illustrated in FIG. 1. In this illustrated cross-connected quad circuit 100, transistors 120 and 150 have multiple emitters, each having a ratio of N and M, respectively. Transistor 120 is coupled to a power source at the collector via a resistor 110 and the multiple emitters of 120 are coupled to the ground via a transistor 130. Specifically, the emitters of transistor 120 are connected in series to the collector of transistor 130, whose emitter is connected to the ground. In addition, the collector of transistor 120 is connected to its base.

On the other side, transistor 150 is coupled to a source of PTAT at the emitter terminal via a transistor 140. The collector of transistor 150 is connected to the single emitter of transistor 140 and the collector of transistor 140 is connected to the source of PTAT. The base of transistor 140 is directly connected to the base of transistor 120, which is connected to its own collector. Transistor 150 is coupled to the ground at its emitter via a serially connected resistor 160. The collector of transistor 150 is connected to the base of transistor 130.

In this illustrated circuit, a $\Delta V_{BE}$ is developed that is proportional to the logarithm of the product of the ratio of emitter current densities. Specifically, the $\Delta V_{BE}$ can be characterized to be $\Delta V_{BE}=V_T*\ln[(J_2*J_3)/(J_1*J_4)]$ or $\Delta V_{BE}=V_T*\ln[(N*M)]$, where N and M are the current density ratios of transistor 120 to transistor 140 and transistor 150 to transistor 130, respectively. It is clear that to achieve a larger $\Delta V_{BE}$, it is more efficient to use a method that incorporates a product of current density ratios.

There are other conventional approaches to bandgap cell design, including the Widlar cell, Brokaw cell, and Dobkin cell. A Dobkin cell is described in detail in U.S. Pat. No. 4,447,784 and depicted in FIG. 2. Circuit 200 in FIG. 2 comprises an error amplifier 250 having its output coupled to a serially connected circuit, having two resistors R3 255 and R4 260 and a diode connected transistor Q3 265. The inputs of the error amplifier 250 are connected to the collectors of a pair of transistors Q1 230 and Q2 245. The bases of transistors 230 and 245 are connected to the two ends of resistor R3 255, where the $\Delta V_{BE}$ is developed. The collectors of transistors Q1 and Q2 are coupled to a power source via, respectively, two resistors R1 225 and R2 240. The emitters of transistors Q1 and Q2 are coupled together and connected to the collector of transistor Q5 235, whose emitter is connected to the ground. Between the power source and the ground, there is a serially connected sub-circuit, comprising a current source 215 and a serially connected diode connected transistor 220 having its collector connected to the current source 215 and its emitter connected to the ground.

As can be seen in FIG. 2, unlike Widlar and Brokaw cells which develop the $\Delta V_{BE}$ between the emitters of a BJT, the Dobkin cell develops the $\Delta V_{BE}$ between the bases of Q1 and Q2. A voltage loop is formed around R3 and the emitter-base junctions of Q1 and Q2.

Mathematically, the $\Delta V_{BE}$ produced by the Dobkin cell is described as $\Delta V_{BE}=V_T*\ln(J_2/J_1)$. In this expression, $V_T=kT/q$ is the thermal voltage with k being the Boltzman's constant ($1.38*10^{-23}$ Joules/Kelvin), T an absolute temperature in Kelvin, and q an electronic charge ($1.602*10^{-19}$ Coulomb). $J_1$ and $J_2$ are the current densities of transistors Q1 and Q2, respectively. Such a current density is dependent on transistor area A and the magnitude of current I going through the collector of the transistor. Accordingly, the $\Delta V_{BE}$ is proportional to $J_2/J_1=(I_2*A_1)/(I_1*A_2)$. Based on this observation, it can be seen that a design of a $\Delta V_{BE}$ generator can include appropriate ratios of either current or the area. When the current flowing through both transistors is identical, the emitter areas become the only factor that will determine the value of $\Delta V_{BE}=V_t*\ln(A_1/A_2)$.

In some prior art solutions, the error amplifier 250 is implemented based on a circuit shown in FIG. 3 (PRIOR ART). In this illustration, the error amplifier 250 comprises 6 transistors, 350, 355, 360, 365, 370, and 375, connected as shown in FIG. 3. With this circuit 300, when there are N emitters in Q1 creating a N:1 ratio, $\Delta V_{BE}$ can be characterized to be $\Delta V_{BE}=V_t*\ln(N)$. The output voltage of a Dobkin cell as shown in FIG. 3 is:

$$V_{OUT}=(1+R_4/R_3)*V_T*\ln(N)+V_{BE3}$$

This voltage loop forces the error amplifier to drive a PTAT current into resistor R3, R4, and transistor 265 whose sum of voltage drops develops the bandgap output voltage. Note that the above circuit is a series voltage reference and Dobkin's original circuit is a shunt voltage reference.

It can be seen that to achieve a larger $\Delta V_{BE}$, a large ratio N of transistors is needed and, hence, a larger die area. In general, the higher the ratio N, the larger the die area. A larger die area costs more. When a $\Delta V_{BE}$ for a high performance bandgap voltage reference is needed, the cost may become a serious concern. For example, a reasonable $\Delta V_{BE}$ for a high performance bandgap voltage reference is about 108 mV at 25° C. Without stacking as in FIG. 1, this would require a ratio of about 64:1 or 65 transistors. Although conventional stacking solutions exist with a "cross-connected quad" approach as shown in FIG. 1, there are other issues that hinder the successful application of conventional stacking solutions. For instance, for each BJT stacked upon another, an additional 0.8V input voltage needs to be added and, thus, introduces the need for a higher input voltage. In addition, there are other negative effects, including a higher level of noise and sometimes unstable circuit behavior.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

The present teaching relates to an improved apparatus and method for generating a large $\Delta V_{BE}$ without using a large number of transistors and without increasing the input voltage beyond that of a non-stacked bandgap cell. Consequently, $\Delta V_{BE}$ can be increased without consuming a large die area. In addition, the present teaching also aims at enhancing the performance of bandgap references via increasing the voltage of a $\Delta V_{BE}$ generator with reduction in bandgap output voltage noise.

In accordance with the present teaching, to reduce the number of transistors used in producing a larger $\Delta V_{BE}$, stacking is applied. For instance, to produce a $\Delta V_{BE}$ of 108 mV at 25° C., two stacks each having an 8:1 ratio can be used. Therefore, a total of 18 transistors can achieve the same level of performance as 65 transistors used in the prior art. This yields a significant reduction of transistors used, which provides exponential reduction in the number of transistors.

Although prior art solutions also adopt stacking, the present teaching stacks multiple $\Delta V_{BE}$s in a manner that does not increase noise, but rather decreases noise, and no additional input voltage beyond that of a non-stacked architecture is required. That is, the same input voltage required for a single $\Delta V_{BE}$ stack is used for a $\Delta V_{BE}$ generator with multiple stacks with the same $\Delta V_{BE}$ voltage. Using a similar example as discussed previously, without stacking, to achieve a $\Delta V_{BE}$ of 216 mV, a ratio of 2191:1 transistors would be required. In accordance with the stacking approach disclosed herein, four stacks each having an 8:1 ratio can be used to achieve 216 mV of $\Delta V_{BE}$ with the same input voltage. In other words, theoretically 36 transistors could achieve the same level of performance as 2192 transistors without increasing the input voltage and still minimizing the noise.

Figure 4:
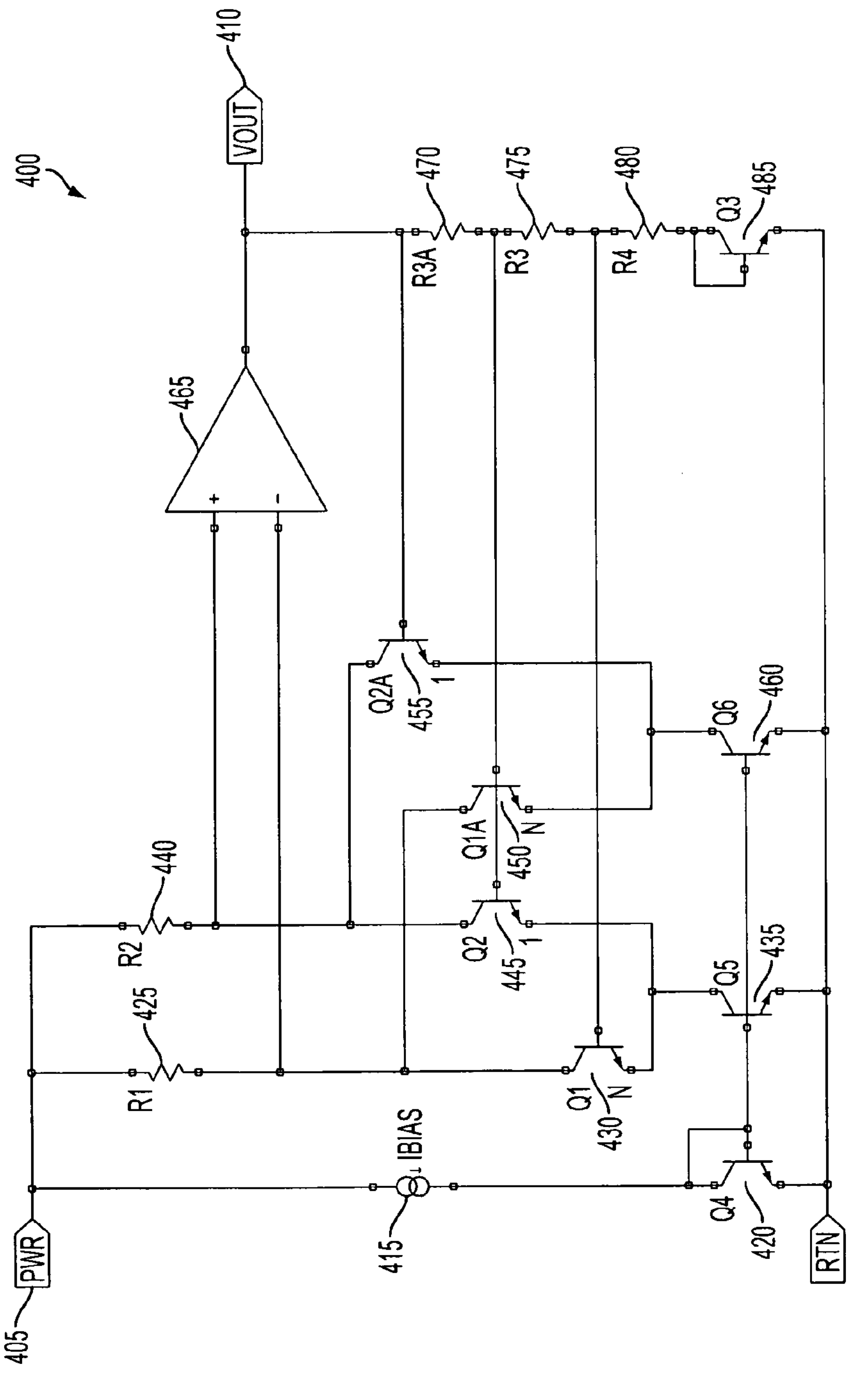
FIG. 4 depicts a stacked Dobkin AVBE cell, according to an embodiment of the present teaching.

The present teaching is illustrated in FIG. 4 having stacking shown with respect to a Dobkin cell. As shown, a stacked bandgap reference circuit 400 comprises two levels of $\Delta V_{BE}$ generators. The stacked bandgap reference circuit 400 comprises an error amplifier 465, a current source path (a current source 415 and a diode connected transistor 420), a sub-circuit connecting between the output of the error amplifier $V_{OUT}$ and the ground (resistors R3A 470, R3 475, R4 480, and Q3 485), a first stack (transistors 430, 435, and 445) and a second stack (transistors 450, 455, and 460).

Although prior art may also stack $\Delta V_{BE}$S, the present teaching stacks additional $\Delta V_{BE}$S in a way so that no additional input voltage is needed beyond that of a non-stacked bandgap cell. Moreover the stacking occurs where the $\Delta V_{BE}$ resistor is between the base terminal of the BJTs. To increase $\Delta V_{BE}$, the illustrated embodiment shows that the first level of $\Delta V_{BE}$ can be directly supplemented by adding a resistor, shown as R3A 470, on top of the existing resistor, R3 475, and an additional emitter ratioed differential pair 450 and 455 with both emitters connected to transistor 460 to the ground. It is understood that although the illustrated embodiment applies stacking in the context of the Dobkin cell, the present teaching is not limited to such a particular context.

In some embodiments, identical stages may be employed. That is, the tail current sources $Q_5$ 435 and $Q_6$ 460 are identical. The $\Delta V_{BE}$ generators, $Q_1$ 430/Q2 445 and $Q_{1A}$ 450/$Q_{2A}$ 455, also have identical current density ratios, say N. The current density ratio can be set by varying the emitter areas, the currents, or both in the corresponding $\Delta V_{BE}$ devices. Consider a Dobkin cell where a $\Delta V_{BE}$ generator comprises $Q_1$, $Q_2$, and $R_3$. An expression to describe the circuit by going around a closed loop containing these devices is $$V_{BE1}+V_{BE2}+V_{R3}=0$$

where $V_{R3}$ is the voltage drop across R3 475 and $V_{BE1}$ and $V_{BE2}$ are the emitter base voltages of devices $Q_1$ 430 and $Q_2$ 445, respectively. As one skilled in the art of bandgap reference design would recognize, $$V_{BE}=V_T*\ln(I_C/(I_S*A))$$

where $V_T$ is the thermal voltage, $I_c$ is the collector current, $I_S$ is the saturation current, and A is the emitter area. The argument of the natural logarithm term is called the current density as earlier denoted as J. The voltage across $R_3$ is given by the expression $V_{R3}=I_1$*R3, where $I_1$ is the current through $R_3$. Combining the natural logarithm terms discussed above, this equation becomes $$I_1=V_T/R_3*\ln(N)$$

where N is the current density ratio of devices $Q_1$ 430 and $Q_2$ 445.

When stacking is applied in a manner as disclosed herein, the expression for $V_{OUT}$ can be similarly derived. Referring to FIG. 4 where a stacked Dobkin cell is shown, based on the closed loop formed by different devices, $V_{OUT}$ can be expressed as $$V_{OUT}=V_{R3A}+V_{R3}+V_{R4}+V_{BE3}$$

Assuming that the base currents of Q1, Q2, Q1A, Q2A can be ignored, this expression can be rewritten as $$V_{OUT}=*(R_{3A}+R_3+R_4)+V_{BE3}$$

Where $I_1$ is the current in resistor $R_{3A}$ 470, $R_3$ 475, $R_4$ 480, and $Q_3$ 485 without the base currents. Considering the closed loop containing the two stacked $\Delta V_{BE}$ generators, we have $$V_{R3A}+V_{R3}+V_{BE1}-V_{BE2}+V_{BE1A}-V_{BE2A}=0$$

Solving for the current $I_1$ yields $$I_1=V_T/(R_{3A}*R_3)*\ln(N^2).$$

Substituting the previous equation, we can derive the expression for $V_{ouT}$ as follows $$V_{OUT}=(1+R_4/(R_{3A}+R_3))*V_T*\ln(N^2)+V_{BE3}$$

In this expression, the first term corresponds to the PTAT term and the second term corresponds to the CTAT term. The natural logarithm term includes an exponent denoting the multiplying effect of stacking two $\Delta V_{BE}$ generators.

By mathematical operation, the exponent in the natural logarithm term can be moved to the front of the PTAT term, making clear the multiplicative effect of the stacking described herein. That is $$V_{OUT}=2*(1+R_4/(R_{3A}+R_3))*V_T*\ln(N)+V_{BE3}.$$

The effect of the added stage is apparent in this derived equation where the PTAT term is doubled. Therefore, by stacking $\Delta V_{BE}$ generators in accordance with the present teaching described herein, the efficient multiplicative effect makes it possible to have much less die area to achieve the same result. In addition, the stacking as described herein does not need additional larger input voltage, as many architectures that achieve a multiplying effect of current densities would require.

The required increase of input voltage for the present teaching is directly proportional to the increase in $\Delta V_{BE}$ as would be for a non-stacked architecture such as a Widlar or Brokaw cell. This is usually on the order of 100 mV. For example, if a 100 mV $\Delta V_{BE}$ is desired, using an architecture without stacking, a current density ratio of 48:1 is required. This in turn requires a total of 49 transistors. With our embodiment using two identical stages the same $\Delta V_{BE}$ can be developed using a current density ratio of 7:1 for a total of 16 transistors.

Figure 5:
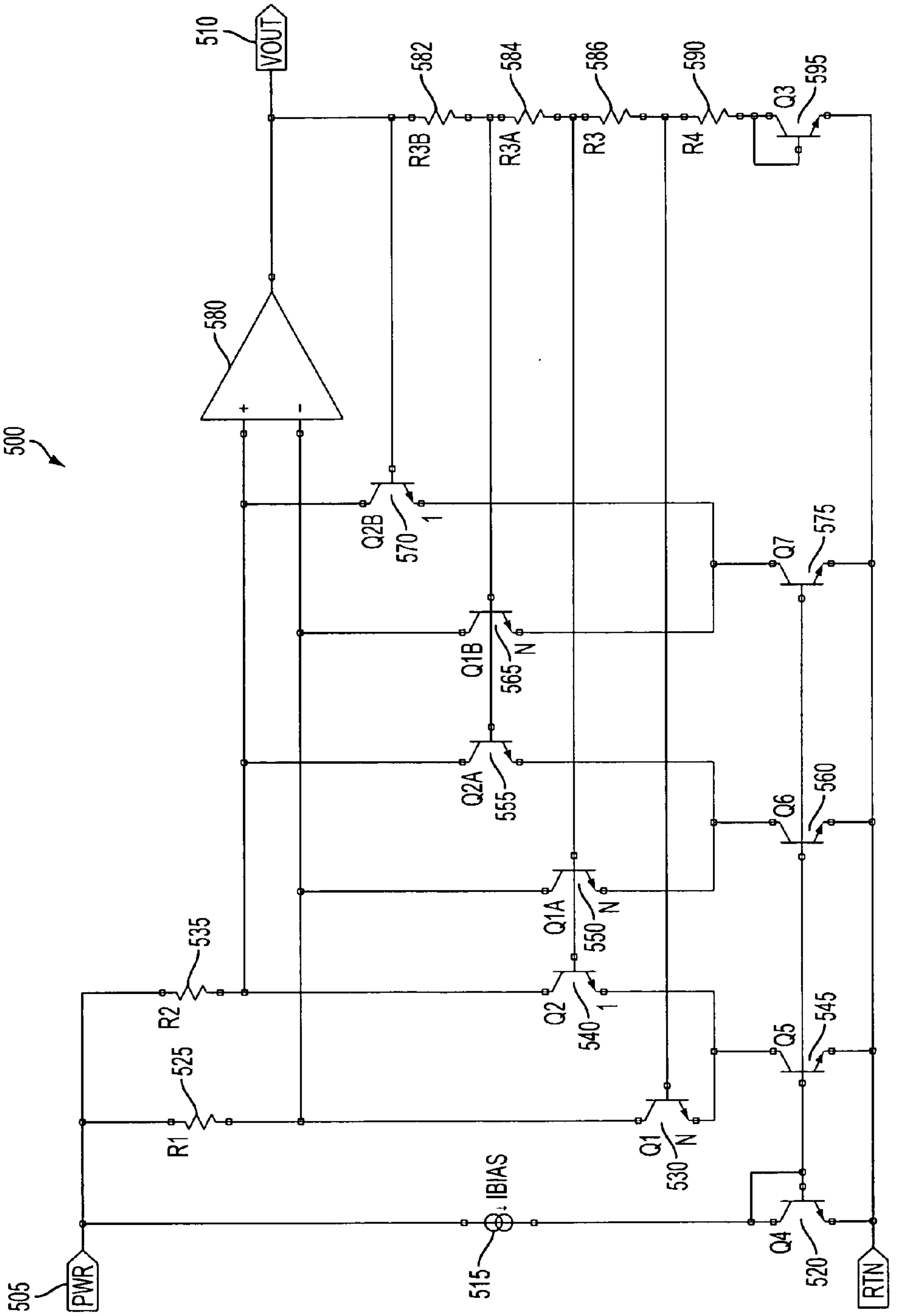
FIG. 5 depicts a stacked Dobkin AVBE cell, according to a different embodiment of the present teaching.

When additional increase in $\Delta V_{BE}$ is needed, more stages can be added as shown in FIG. 5 where a triple stacked Dobkin cell is illustrated, according to an embodiment of the present teaching. With three stacked $\Delta V_{BE}$ generators, the expression for the output voltage is $$V_{OUT}=(1+R_4/(R_{3B}+R_{3A}+R_3))*V_T*\ln(N^3)+V_{BE3}, \text{ or}$$

$$V_{OUT}=3*(1+R_4/(R_{3B}+R_{3A}+R_3))*V_T*\ln(N)+V_{BE3}$$

Generally, there is no inherent limit to the number of stages that can be stacked in accordance with the present teaching. When there are K stages stacked together, assuming K identical stages each having current density ratio N:1, a general expression for the output voltage can be derived as $$V_{OUT}=K*(1+R_4/(K*R_3))*V_T*\ln(N)+V_{BE3}$$

It is clear that the natural logarithm of the product of transistor ratios increases exponentially with respect to a conventional bandgap without a stacked $\Delta V_{BE}$ generator.

The above discussion assumes that $R_3=R_{3A}=R_{3B}$ . . . and the emitter ratios, N, of the differential pairs are perfectly identical. In practice due to mismatches in manufacturing, this will not be the case. However, the current ratio in the differential pairs will be close enough to dynamically adjust so that the PTAT current through $R_3$ is equal to the PTAT current through $R_{3A}$.

As discussed herein, the stacking according to the present teaching also reduces noise. Specifically, noise reduction is achieved by breaking up the $\Delta V_{BE}$ cell into multiple devices. When they are broken up, the noise in separate devices are uncorrelated, making the total noise a combination of RSS (root-sum-square) and, thus, smaller. As someone skilled in the art of analog design would recognize, devices at the input of the amplifier (e.g., error amplifier 465 in FIG. 4 and error amplifier 580 in FIG. 5) are usually the dominate contributors to noise. In some embodiments, such noise may be reduced by increasing the current density ratio, N. This reduces the noise because it lowers the gain required in the PTAT term.

In this embodiment, the emitter current density can be made arbitrarily large without much cost in the die area resulting in less gain needed. In addition, the overall PTAT resistance from various resistors, e.g., $R_{3A}$, $R_{3B}$B, . . . , is now broken up into several individual pieces. In a single stage $\Delta V_{BE}$ generator, the noise with respect to this overall resistance is 4kTRB, where k is Boltzman's constant, T is temperature in Kelvin, R is the resistance, and B is the bandwidth. That is, when a single stage is used, the noise is a combination of the noise sources from that stage. When stacking as disclosed herein is applied (e.g., three stage stacking), since the overall PTAT resistor is broken up into several individual pieces in corresponding stacks, the resulting overall noise is root, sum, squared (RSS) together as an overall resistance. This is shown in the equation below $$E_{nT}=(E_{R3}{}^2+E_{R3A}{}^2+E_{R3B}{}^2)^{1/2}$$

where $E_{nT}$ is the total noise level and $E_{R3}$, $E_{R3A}$, $E_{R3B}$ are the noise sources from the three individual $\Delta V_{BE}$ generators.

Particularly, when identical stages are stacked, the total noise combined is determined by $E'_n=E_n/\sqrt{N}$, where $E_n$ is the noise from each stage and N is the number of stages. Thus, the total noise level of the stacked $\Delta V_{BE}$ generator is $\sqrt{N}$ times less than that of each of the individual stages.

The above discussion is based on specific exemplary embodiments. Although not limiting, it is understood that there are various implementations that may be employed to realize the present teaching. For instance, in FIG. 4 and FIG. 5, the circuit bias currents 415 and 515 are shown coming from a current source. This bias current can also be realized as a resistor. In addition, the current source could be temperature independent, PTAT, CTAT, or some other variations. The tail current sources, e.g., transistors $Q_5$ and $Q_6$ in FIG. 4 and Q7 in FIG. 5 can be identical or set to have different values. The emitter ratios or current density of the $\Delta V_{BE}$ generators $Q_1/Q_2$, $Q_{1A}/Q_{2A}$, and $Q_{1B}/Q_{2B}$, can be identical or set to different ratios. The resistors $R_3$, $R_{3A}$, and $R_{3B}$, can be identical or set to different values. The collector resistors, $R_1$ and $R_2$, can be identical or set to different values.

The discussion above with respect to stacking is based on the assumption that the base current is ignored. Consider the double stacked Dobkin cell (shown in FIG. 4). A source of output voltage error may occur due to the base currents flowing through transistors $Q_1$ 430, $Q_2$ 445, and $Q_{1A}$ 450. The current from the error amplifier 465 that reaches resistor $R_3$ 475 is $2*I_B$ (combined base currents of transistors $Q_{1A}$ 450 and $Q_2$ 445) less than the current flowing through transistor $R_{3A}$ 470. It reduces by another $I_B$ (base current of $Q_1$ 430) when the current gets to resistor $R_4$ 480 and transistor $Q_3$ 485. These base currents vary with temperature causing a temperature dependent error which detracts from the temperature independent circuit.

Figure 6:
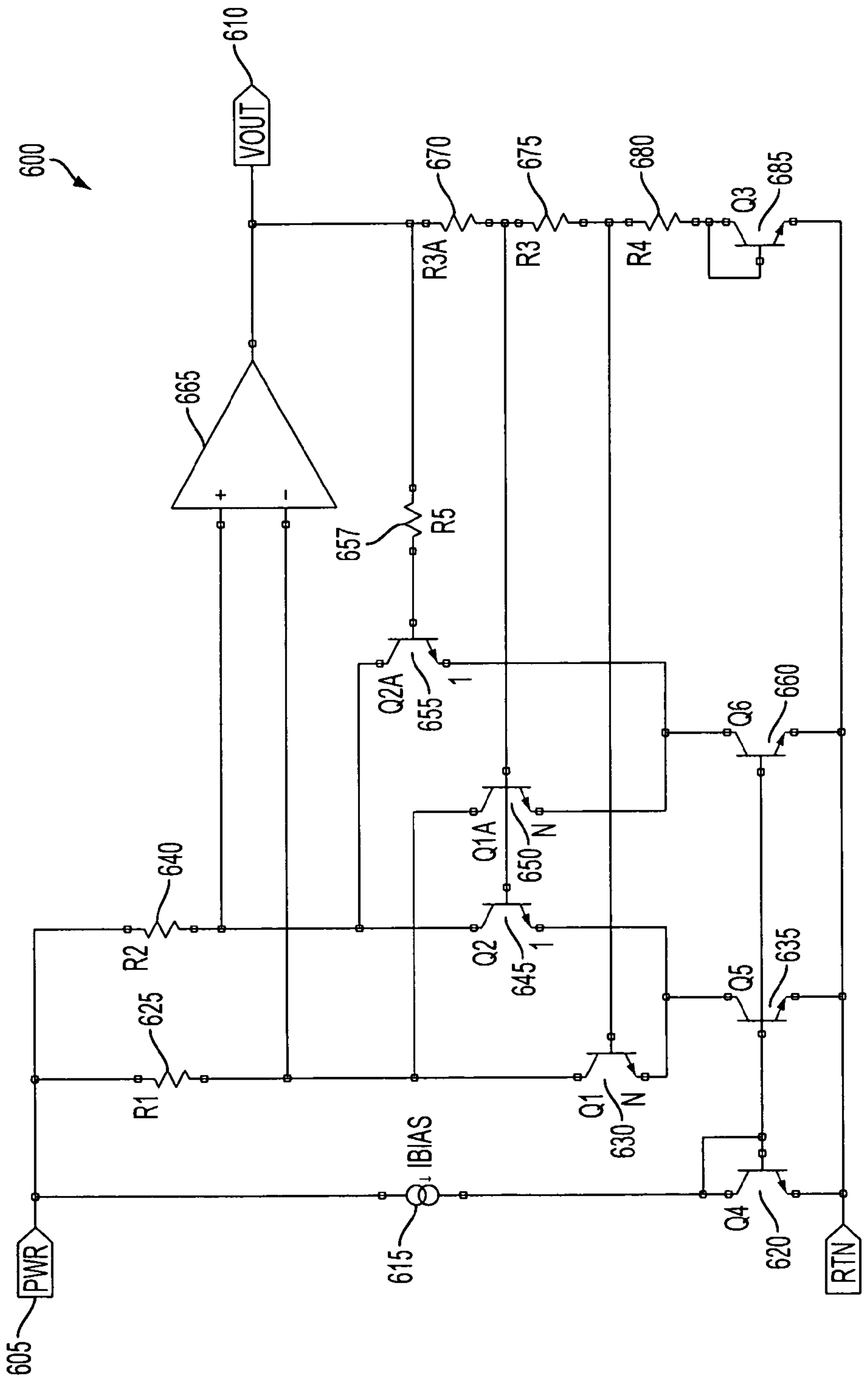
FIG. 6 depicts a triple stacked Dobkin AVBE cell, according to an embodiment of the present teaching.

When base current is taken into account in the analysis, it can be shown that in addition to the ideal output voltage terms PTAT and CTAT, an error due to base currents exists. To eliminate this error, FIG. 6 illustrates an exemplary solution. Circuit 600 as shown in FIG. 6 includes all similar components as in FIG. 4 with an additional resistor, $R_5$ 657, inserted between $V_{OUT}$ and the base of transistor $Q_{2A}$ 655. To overcome the error caused by base currents, the value of $R_5$ can be determined as follows $$R_5=R_4*(3*R_{3A}+R_3)/(R_{3A}+R_3+R_4)$$

When two identical stages are stacked, i.e., $R_{3A}=R_3$, this reduces to $$R_5=4*R_3*R_4/(2*R_3+R_4)$$

In some embodiments, as the number of stages and the ratio of emitter areas increase, the $\Delta V_{BE}$ PTAT term may eventually exceed the $V_{BE}$ CTAT term, thus effectively eliminating resistor $R_4$ (e.g., resistor 590 in FIG. 5) altogether. When this occurs, different exemplary approaches may be employed to boost the CTAT term.

Figure 7:
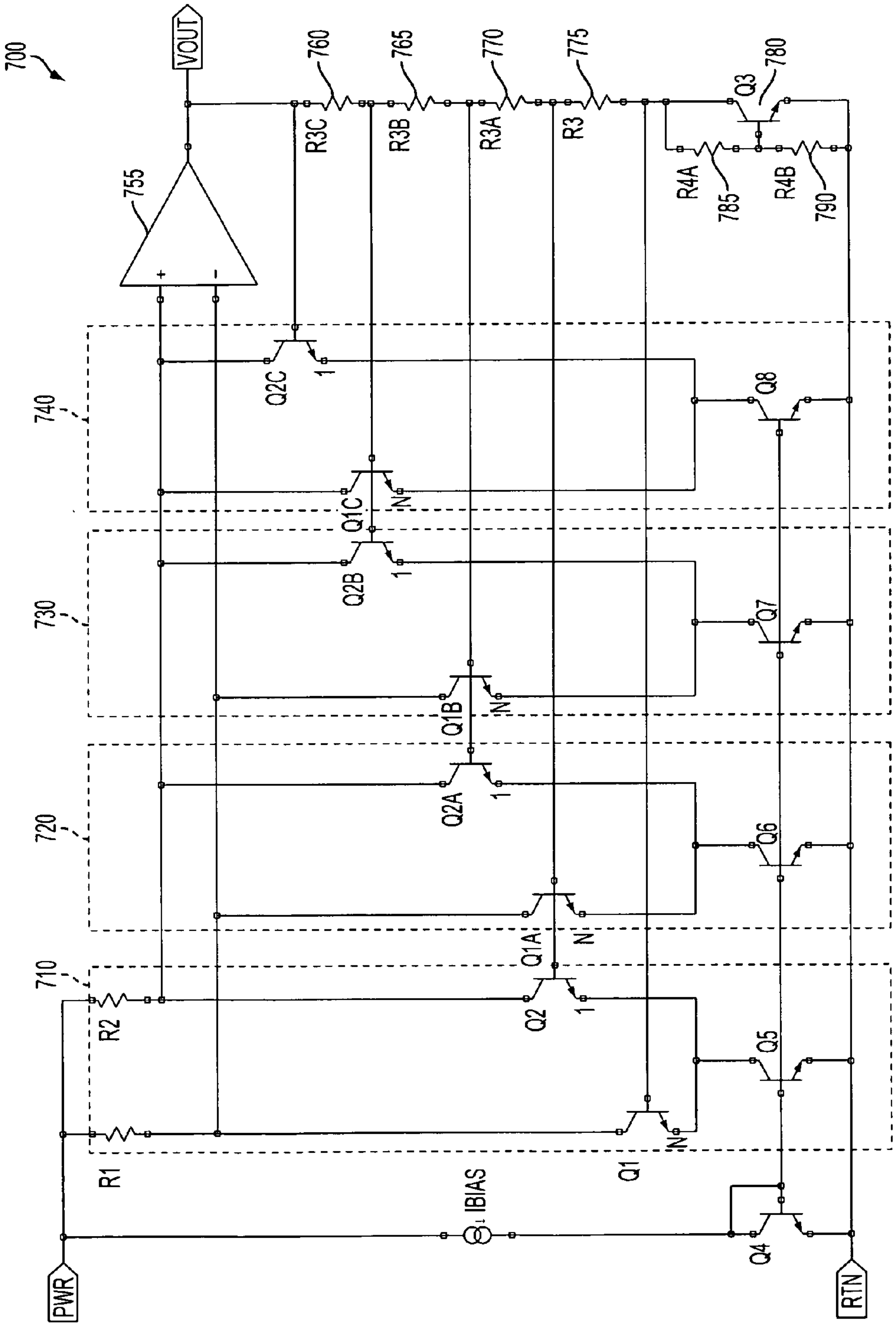
FIGS. 7-10 depict different implementations of a stacked Dobkin AVBE cell, according to different embodiments of the present teaching.

The first exemplary approach is to employ a $V_{BE}$ multiplier. This is illustrated in FIG. 7, where circuit 700 comprises four stages of stacking, 710, 720, 730, and 740, an error amplifier 755, and a sub-circuit connecting the voltage output of the circuit 700 and the ground, including resistors $R_{3C}$ 760, $R_{3B}$ 765, $R_{3A}$ 770, $R_3$ 775, transistor $Q_3$ 780 and resistors $R_{4A}$ 785 and $R_{4B}$ 790. Resistors $R_{4A}$ 785 and $R_{4B}$ 790 are connected in series with the middle connection point coupled to the base of transistor $Q_3$ 780, one end of the series connected to the collector of transistor $Q_3$ 780, and the other end of the series connected to the emitter of transistor $Q_3$ 780. With this solution, the voltage across the transistor $Q_3$ 780 is multiplied by a factor determined based on the ratio of $R_{4A}$ 785 to $R_{4B}$ 790, i.e., $(1+R_{4A}/R_{4B})$. This multiplying factor will enable an increase of the CTAT term and allow for an even larger PTAT term.

Figure 8:
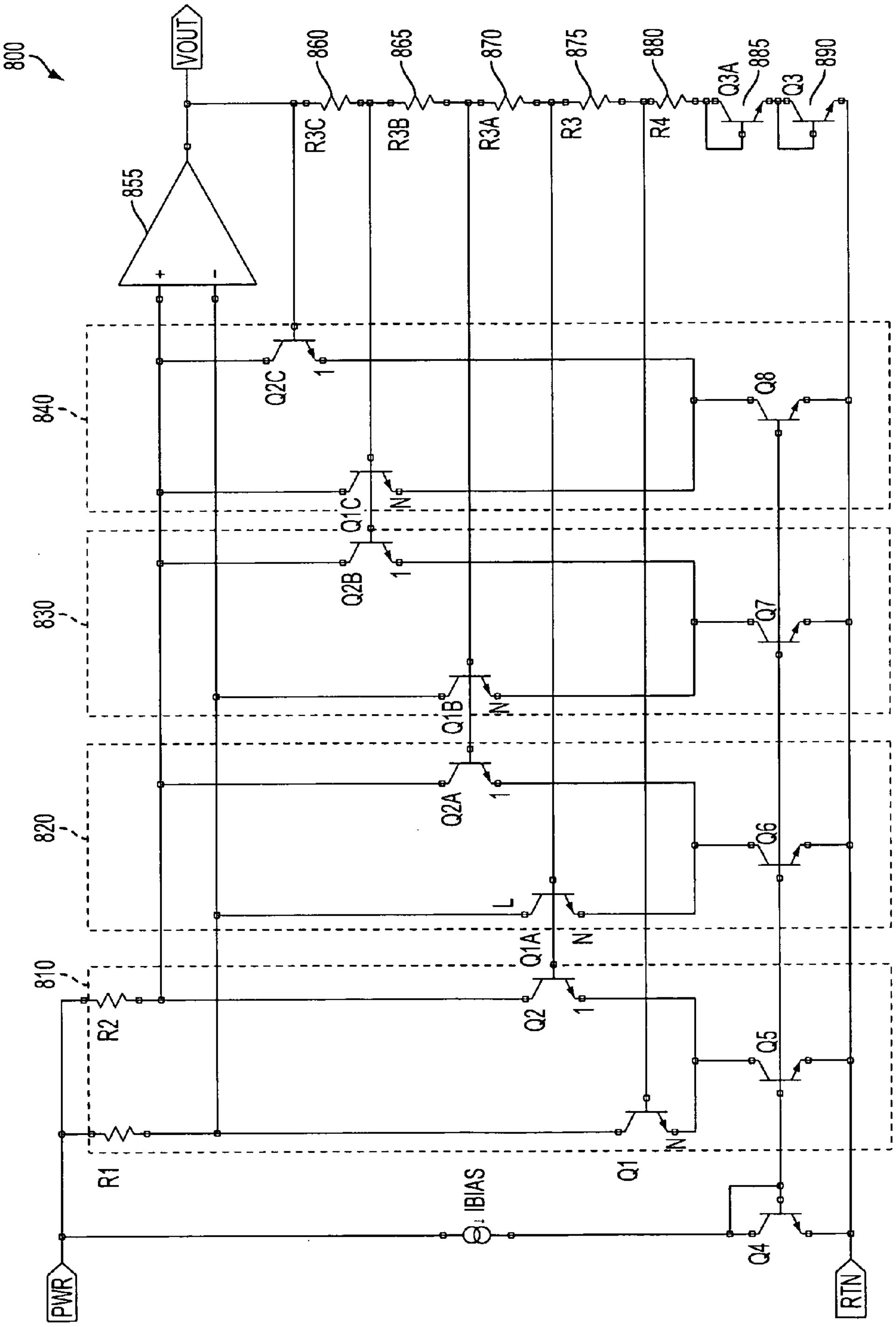

The second exemplary approach is to employ two $V_{BE}$S and retain resistor, $R_4$. This exemplary solution is illustrated in FIG. 8. In this illustrated embodiment, circuit 800 comprises four stages of stacking, 810, 820, 830, and 840, an error amplifier 855, and a sub-circuit connecting the voltage output of the circuit 800 and the ground, including serially connected resistors $R_{3C}$ 860, $R_{3B}$ 865, $R_{3A}$ 870, $R_3$ 875, $R_4$ 880, and two transistors $Q_{3A}$ 885 and $Q_3$ 890. The two $V_{BE}$S require a larger PTAT term which can be accomplished by increasing $\Delta V_{BE}$ through additional stages and/or increasing the value of $R_4$ 880. The order of devices in the sub-circuit may not be important. For example, the diode connected devices $Q_3$ 890 and $Q_{3A}$ 885 need not be arranged together.

Figure 9:
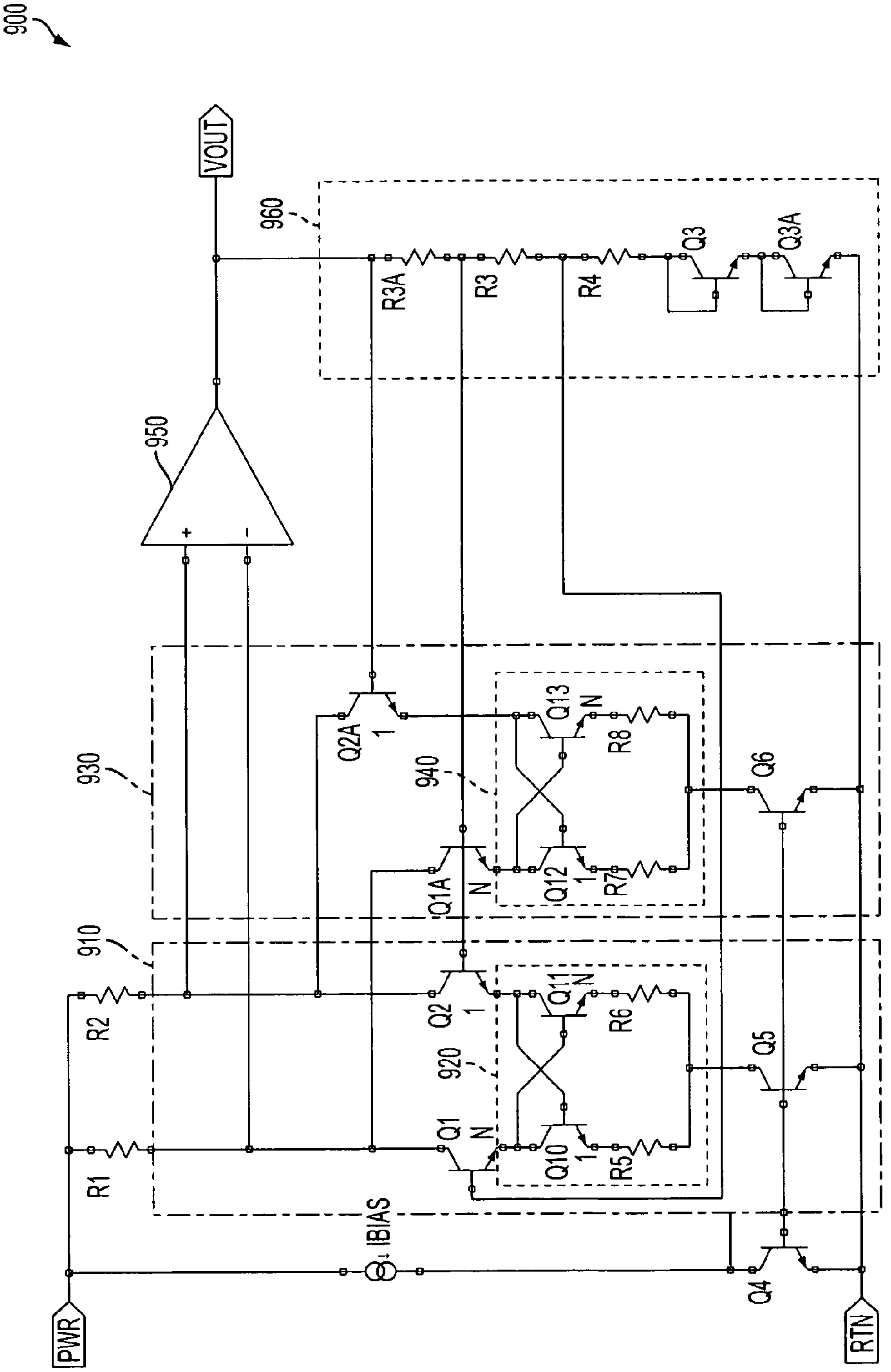

In some embodiments, another approach may be employed to increase the $\Delta V_{BE}$. This is shown in FIG. 9, where a cross-coupled $V_{BE}$ loop is added within each PTAT generator. For instance, in PTAT generator 910, a cross-coupled $V_{BE}$ loop 920 is added between a pair of differential transistors and its corresponding tail current source. In PTAT generator 930, a cross-coupled $V_{BE}$ loop 940 is added between a pair of differential transistors and its corresponding tail current source. Resistors $R_5$-$R_8$ in those added cross-coupled loops are for reducing the $g_m$ of the additional devices to keep the circuit stable. The specific illustration of the sub-circuit 960 in FIG. 9 used the same circuit as shown in FIG. 8. However, any implementation of the same circuitry described herein may be employed.

Figure 10:
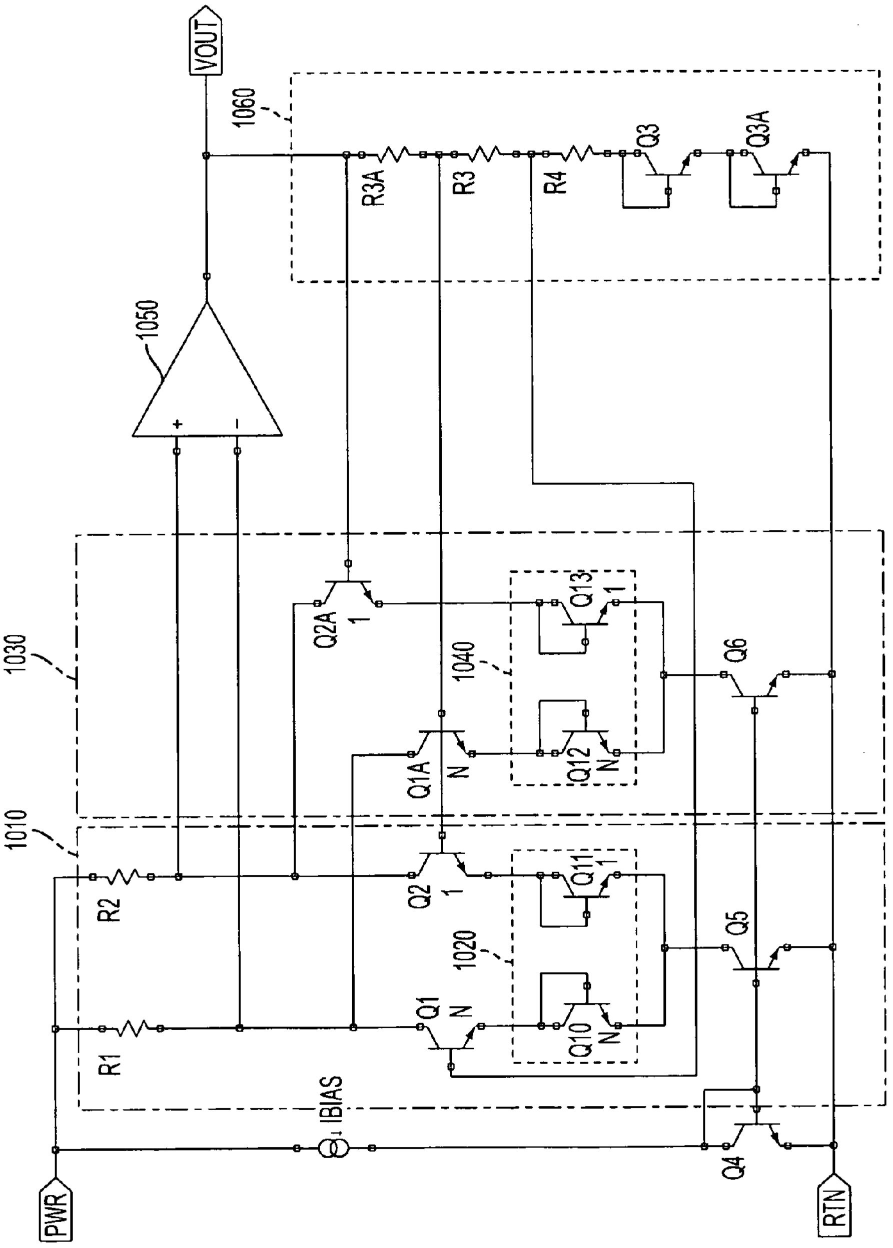

In some embodiments, still another approach may be adopted to increase the $\Delta V_{BE}$ within a stage. In accordance with this approach, diode connected devices may be introduced in PTAT generators. This is shown in FIG. 10. For instance, in PTAT generator 1010, a pair of diode connected devices 1020 are added between a pair of differential transistors and their corresponding tail current source. In PTAT generator 1030, another pair of diode connected devices 1040 are added between a pair of different transistors and their corresponding tail current source. The sub-circuit 1060 between the output of error amplifier 1050 and the ground can be implemented in accordance with any of the embodiments discussed herein. Using these alternative approaches, an additional diode connected BJT, $Q_{3A}$, is added to the output string.

Figure 1:
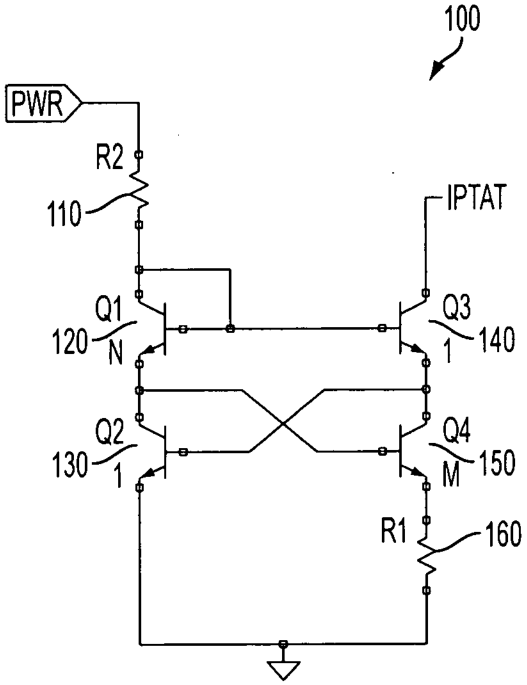
FIG. 1 PRIOR ART
FIG. 1 (Prior Art) illustrates a circuit with a cross-connected quad.
Figure 2:
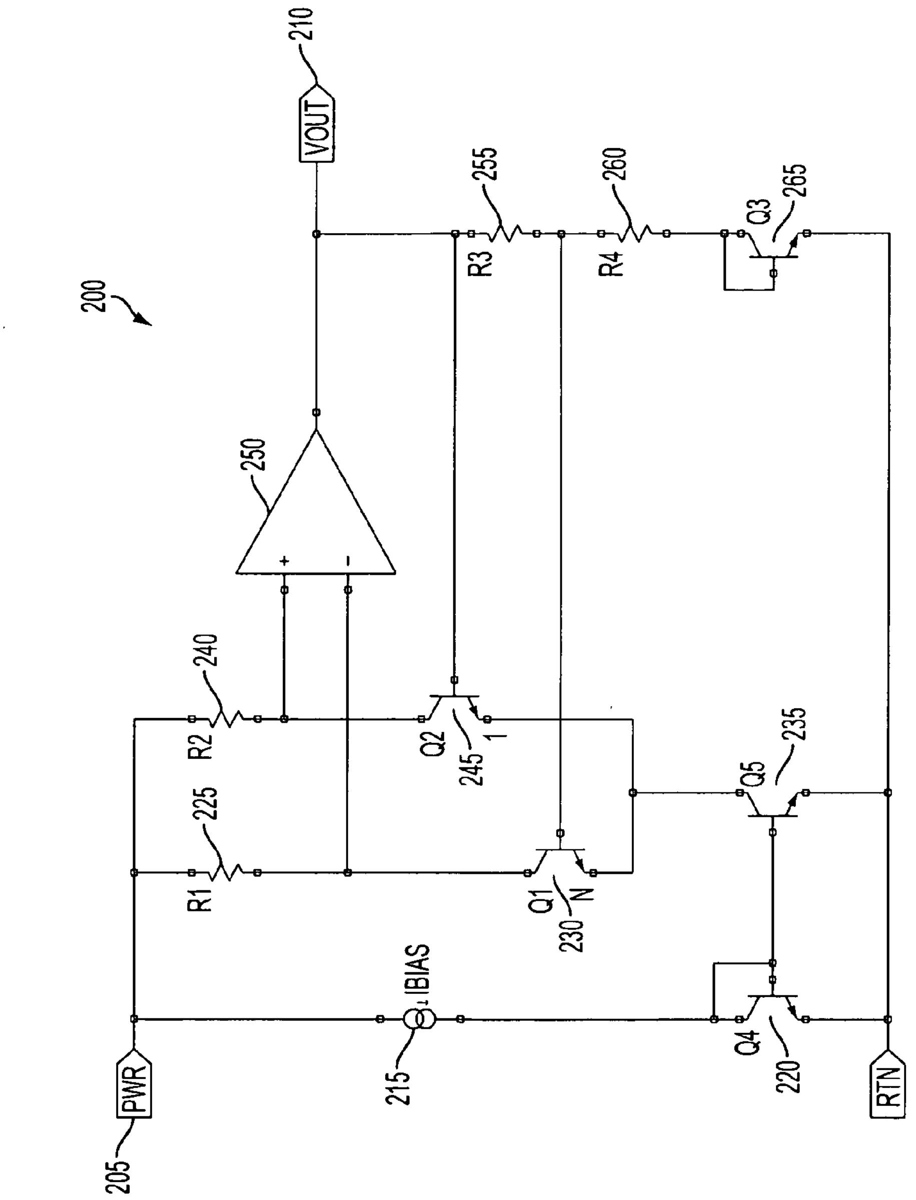
FIG. 2 PRIOR ART
FIG. 2 (Prior Art) illustrates a Dobkin bandgap reference cell.
Figure 3:
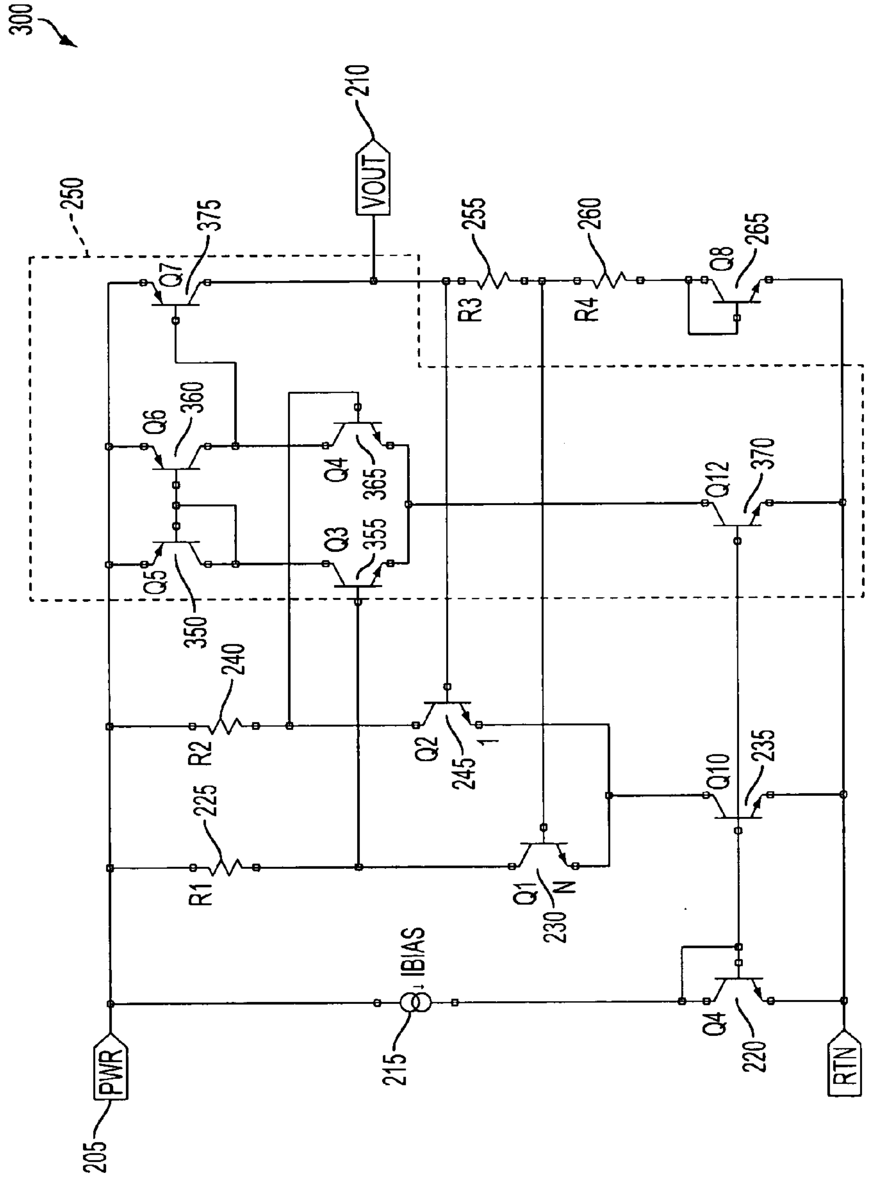
FIG. 3 PRIOR ART
FIG. 3 (Prior Art) illustrates a Dobkin bandgap reference cell with an implemented error amplifier.

There are other variations in implementing the present teaching. For example, NPN transistors may be replaced with PNP transistors. Without deviating from the present teaching, base current cancellation or curvature correction schemes may also be included in the implementations. In some embodiments, currents may be ratioed through $\Delta V_{BE}$ cells to increase the $\Delta V_{BE}$. Devices used for current source(s) or error amplifiers may be based on MOSFETS. A shunt regulator instead of series regulator may also be employed. In implementing the error amplifier (e.g., 460, 580, 665, 755, 855, 950, 1050 in FIGS. 4-10), an architecture different from what is shown in FIG. 3 may be used. In addition, multiple input error amplifiers may also be used. Furthermore, in different implementations, an error amplifier therein may be biased differently. Rather than using a independent current source 415, a current can be internally generated and bootstrapped eliminating the need for additional bias circuitry.

In some embodiments, the diode connected device Q3 (see FIGS. 4-10) may be similarly used as in a Dobkin cell to gain up the output voltage beyond a bandgap voltage. Moreover, components R3, R4, and Q3 may be interchanged. Two or more diode connected devices may be used in the output. A current reference may be alternatively employed in place of a voltage reference. Overall, in accordance with the present teaching, a larger $\Delta V_{BE}$ can be achieved with fewer transistors without the penalty of a higher input voltage supply or increased noise. A larger $\Delta V_{BE}$ translates into a high performance low noise voltage or current reference.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. A system for a stacked $\Delta V_{BE}$ generator for generating a $\Delta V_{BE}$, comprising:

an error amplifier configured to generate an output based on an error signal;

a first stack of the $\Delta V_{BE}$ generator for producing a first $\Delta V_{BE}$, the first stack being coupled to the error amplifier to form a closed loop and including a first pair of transistors;

a second stack of the $\Delta V_{BE}$ generator for producing a second $\Delta V_{BE}$, the second stack being coupled to the first stack and including a second pair of transistors, a first resistor at which the first $\Delta V_{BE}$ is formed, the first resistor being coupled between a base of a first transistor in the first pair and a base of a first transistor in the second pair, and a second resistor at which the second $\Delta V_{BE}$ is formed, the second resistor being coupled between a base of a second transistor in the first pair and a base of a second transistor in the second pair, wherein the $\Delta V_{BE}$ is determined as the sum of first voltage across the first resistor and second voltage across the second resistor.

2. The system of claim 1, further comprising a third resistor and a third transistor serially connected to the first and second resistors, wherein the second resistor is connected to the output of the error amplifier.

3. The system of claim 1, further comprising:

a current source coupled to a power supply; and a diode connected fourth transistor having its collector connected to the current source and its emitter connected to the ground.

4. The system of claim 2, wherein the first stack further comprises:

a fifth transistor having emitter coupled to emitters of the first and second transistors in the first pair, collector of the first transistor in the first pair connecting to a negative input of the error amplifier, and collector of the second transistor in the second pair connecting to a positive input of the error amplifier;

fourth and fifth resistors connecting the respective collectors of the first and second transistors in the first pair to the power supply;

the fifth transistor having its base coupled to the gate of the diode connected fourth transistor, having its collector coupled to the emitters of the first and second transistors in the first pair, and having its emitter connected to the ground.

5. The system of claim 2, wherein the third transistor is a diode connected transistor;

emitter of the third transistor is connected to the ground; and base and collector of the third transistor are connected to the third resistor.

6. The system of claim 4, wherein the second stack further comprises:

a fifth transistor having emitter coupled to emitters of the first and second transistors in the second pair, collector of the first transistor in the second pair connecting to the collector of the first transistor in the second pair, and collector of the second transistor in the second pair connecting to the collector of the second transistor in the first pair; and the sixth transistor having its emitter connected to the ground, having its base connected to the base of the fifth transistor, and having its collector coupled to the emitters of the first and second transistors in the second pair.

7. The system of claim 6, wherein the first transistor in the second pair is coupled to the output of the error amplifier.

8. The system of claim 6, wherein the emitters of the first and second transistors in the first pair are connected to a first cross-coupled $V_{BE}$ loop; and the emitters of the first and second transistors in the second pair are connected to a second cross-coupled $V_{BE}$ loop.

9. The system of claim 8, wherein the first cross-coupled $V_{BE}$ loop comprises:

serially connected seventh transistor and sixth resistor where the collector of the seventh transistor is connected to the emitter of the third transistor and emitter of the seventh transistor is serially connected to the sixth resistor, which is connected to collector of the third transistor;

serially connected eighth transistor and seventh resistor where the collector of the eighth transistor is connected to the emitter of the second transistor in the first pair and emitter of the eighth transistor is serially connected to the seventh resistor, which is connected to collector of the fifth transistor.

10. The system of claim 9, wherein the base of the seventh transistor is connected to the collector of the eighth transistor and the base of the eighth transistor is connected to the collector of the seventh transistor.

11. The system of claim 8, wherein the second cross-coupled $V_{BE}$ loop comprises:

serially connected ninth transistor and eighth resistor where the collector of the eighth transistor is connected to the emitter of the second transistor in the second pair and emitter of the eighth transistor is connected to the eighth resistor, which is connected to the collector of the sixth transistor;

serially connected tenth transistor and ninth resistor where the collector of the tenth transistor is connected to the emitter of the first transistor in the first second pair and emitter of the tenth transistor is connected to the ninth resistor, which is connected to the collector of the sixth transistor.

12. The system of claim 11, wherein the base of the ninth transistor is connected to the collector of the tenth transistor and the base of the tenth transistor is connected to the collector of the ninth transistor.

13. The system of claim 6, wherein the emitters of the first and second transistors in the first pair are connected to first and second diode connected transistors; and the emitters of the first and second transistors in the second pair are connected to third and fourth diode connected transistors.

14. The system of claim 13, wherein:

collector of the first diode connected transistor is connected to the emitter of the first transistor in the first pair and emitter of the first diode connected transistor connected to collector of the fifth transistor; and collector of the second diode connected transistor is connected to the emitter of the second transistor in the first pair and emitter of the second diode connected transistor is connected to collector of the fifth transistor.

15. The system of claim 13, wherein:

collector of the third diode connected transistor is connected to the emitter of the second transistor in the second pair and emitter of the third diode connected transistor is connected to collector of the sixth transistor; and collector of the fourth diode connected transistor is connected to the emitter of the first transistor in the second pair and emitter of the fourth diode connected transistor is connected to collector of the sixth transistor.

16. The system of claim 1, wherein the first stack is identical to the second stack and the individual $\Delta V_{BE}$ generated by the first stack is the same as the individual $\Delta V_{BE}$ generated by the second stack.

17. The system of claim 1, wherein input voltage for the stacked $\Delta V_{BE}$ generator is the same as that for the first stack.

18. A system for a k-stacked $\Delta V_{BE}$ generator for generating a $\Delta V_{BE}$, where k is greater than 1, comprising:

an error amplifier configured to generate an output based on an error signal in a closed loop configuration;

a first stack of the $\Delta V_{BE}$ generator for producing a first $\Delta V_{BE}$, the first stack being coupled to the error amplifier to provide the error signal to the error amplifier, and including a first pair of transistors; and second to kth stacks of the $\Delta V_{BE}$ generator for producing a second $\Delta V_{BE}$ to a kth $\Delta V_{BE}$, respectively, the second to kth stacks being coupled to the first stack and including a second to kth pairs of transistors, wherein the first stack includes a first resistor at which the first $\Delta V_{BE}$ is formed, the first resistor being coupled between bases of transistors in the first pair of transistors, the second to kth stacks respectively include second to kth resistors at which the second $\Delta V_{BE}$ to the kth $\Delta V_{BE}$ are formed, the second to kth resistors being coupled between bases of transistors in the second to kth pairs of transistors, respectively, and the $\Delta V_{BE}$ is determined as the sum of first to kth voltages across the first to kth resistors.

19. The system of claim 18, wherein the first stack is identical to any of the 2nd-kth stacks and the individual $\Delta V_{BE}$ generated by the first stack equals to any individual $\Delta V_{BE}$s generated by any of the k−1 stacks so that the $\Delta V_{BE}$ is k times an individual $\Delta V_{BE}$.

20. The system of claim 18, wherein the first stack comprises:

first and second transistors having their emitters coupled to a third transistor;

the first resistor is connected between bases of the first and second transistors, collector of the first transistor connecting to a negative input of the error amplifier, and collector of the second transistor connecting to a positive input of the error amplifier; and the third transistor having its base coupled to the first sub-circuit, having its collector coupled to the emitters of the first and second transistors, and having its emitter connected to the ground.

21. The system of claim 20, wherein an ith stack comprises:

(3*(i−1)+1)th and (3*(i−1)+2)th transistors having their emitters coupled to (3*(i−1)+3)th transistor, where i is in a range between 1 and k;

an ith resistor connected between bases of the (3*(i−1)+1)th and (3*(i−1)+2)th transistors, wherein base of the (3*(i−1)+1)th transistor is connected to the base of (3*(i−2)+2)th transistor, collector of the (3*(i−1)+1)th transistor connecting to a negative input of the error amplifier, and collector of the (3*(i−1)+2)th transistor connecting to a positive input of the error amplifier;

the (3*(i−1)+3)th transistor having its gate coupled to the base of (3*(i−2)+3)th transistor, its collector coupled to the emitters of the (3*(i−1)+1)th and (3*(i−1)+2)th transistors, and its emitter connected to the ground.

22. The system of claim 21, wherein base of the (3*k+2)th transistor in the kth stack is coupled to the output of the error amplifier.

23. The system of claim 22, wherein the base of the (3*k+2)th transistor in the kth stack is coupled to the output of the error amplifier via an added resistor.

24. The system of claim 20, further comprising two additional resistors, where the first additional resistor connects the collector of the first transistor to the power supply and the second additional resistor connects the collector of the second transistor to the power supply.

25. The system of claim 20, further comprising a sub-circuit coupled to the first transistor.

26. The system of claim 25, wherein the sub-circuit comprises one or more serially connected transistors.

27. The system of claim 26, wherein the one or more serially connected transistors are diode connected;

emitter of each of the one or more serially connected transistors is connected to collector of adjacent serially connected diode connected transistor;

emitter of a last of the one or more serially connected transistors is connected to the ground.

28. The system of claim 26, further comprising an additional resistor serially connected to the first resistor and the one or more serially connected transistors.

29. The system of claim 28, wherein collector of a first of the serially connected transistors is serially connected to the additional resistor.

30. The system of claim 25, wherein the sub-circuit includes a transistor and two resistors, where one of the two resistors is connected between collector and base of the transistor and the other of the two resistors is connected between the base and emitter of the transistor.

31. The system of claim 21, wherein the emitters of the (3*(i−1)+1)th and (3*(i−1)+2)th transistors in the ith stack are connected to a cross-coupled $V_{BE}$ loop.

32. The system of claim 31, wherein the cross-coupled $V_{BE}$ loop comprises:

a first serially connected transistor and resistor where collector of the first serially connected transistor is connected to the emitter of the (3*(i−1)+1)th transistor and emitter of the first serially connected transistor is connected to the first serially connected resistor, which is connected to the collector of the (3*(i−1)+3)th transistor;

a second serially connected transistor and resistor where collector of the (3*(i−1)+2)th transistor is connected to emitter of the second serially connected transistor and emitter of the second serially connected transistor is connected to the second serially connected resistor, which is connected to the collector of the (3*(i−1)+3)th transistor.

33. The system of claim 21, wherein the emitters of the (3*(i−1)+1)th and (3*(i−1)+2)th transistors in the ith stack are connected to a pair of diode connected devices.

34. The system of claim 33, wherein:

collector of a first of the pair of diode connected transistors is connected to the emitter of the (3*(i−1)+1)th transistor and emitter of the first of the pair of diode connected transistors is connected to collector of the (3*(i−1)+3)th transistor; and collector of a second of the pair of diode connected transistors is connected to the emitter of the (3*(i−1)+2)th transistor and emitter of the second of the pair of diode connected transistors is connected to collector of the (3*(i−1)+3)th transistor.

35. The system of claim 18, wherein input voltage for the k stacked $\Delta V_{BE}$ generator is the same for the first stack.

36. An apparatus, comprising:

a system configured for performing one or more functions based on a voltage reference;

a k-stacked $\Delta V_{BE}$ generator for generating a $\Delta V_{BE}$ corresponding to the voltage reference, wherein k is greater than one and the k-stacked $\Delta V_{BE}$ generator comprises:

an error amplifier configured to generate an output based on an error signal in a closed loop configuration;

a first stack of the $\Delta V_{BE}$ generator for producing a first $\Delta V_{BE}$, the first stack being coupled to the error amplifier to provide the error signal to the error amplifier and including a first pair of transistors;

second to kth stacks of the $\Delta V_{BE}$ generator for producing a second $\Delta V_{BE}$ to a kth $\Delta V_{BE}$, respectively, the second to kth stacks being coupled to the first stack and including second to kth pairs of transistors, wherein the first stack includes a first resistor at which the first $\Delta V_{BE}$ is formed, the first resistor being coupled between bases of transistors in the first pair of transistors, the second to kth stacks respectively include second to kth resistors at which the second $\Delta V_{BE}$ to the kth $\Delta V_{BE}$ are formed, the second to kth resistors being coupled between bases of transistors in the second to kth pairs of transistors, respectively, and the $\Delta V_{BE}$ is determined as the sum of first to kth voltages across the first to kth resistors.

* * * * *

UNITED STATES PATENT AND TRADEMARK OFFICE

CERTIFICATE OF CORRECTION

PATENT NO. : 8,508,211 B1
APPLICATION NO. : 12/616996
DATED : August 13, 2013
INVENTOR(S) : Michael Brian Anderson It is certified that error appears in the above-identified patent and that said Letters Patent is hereby corrected as shown below:

In the Specification

Column 4, line 50:

Delete "$V_{OUT}$=*($R_{3A}$+$R_3$+$R_4$)+$V_{BE3}$" and insert -- $V_{OUT}$=$I_1$*($R_{3A}$+$R_3$+$R_4$)+$V_{BE3}$ --

Signed and Sealed this
Twenty-fourth Day of June, 2014

Michelle K. Lee
*Deputy Director of the United States Patent and Trademark Office*